Feb. 1, 1966 H. E. RUEHLEMANN ETAL 3,233,208

CONTACT FOR DIRECT RECEPTION OF PRINTED CIRCUIT BOARD

Filed Sept. 6, 1963 3 Sheets-Sheet 1

INVENTORS
HERBERT E. RUEHLEMANN
HERMAN GORDON

BY Caesar and Rivise

ATTORNEYS

CONTACT FOR DIRECT RECEPTION OF PRINTED CIRCUIT BOARD

INVENTORS
HERBERT E. RUEHLEMANN
HERMAN GORDON
BY
Caesar and Rivise
ATTORNEYS

CONTACT FOR DIRECT RECEPTION OF PRINTED CIRCUIT BOARD

Filed Sept. 6, 1963 3 Sheets-Sheet 3

INVENTORS
HERBERT E. RUEHLEMANN
HERMAN GORDON
BY
Caesar and Rivise
ATTORNEYS 3,233,208
Patented Feb. 1, 1966

3,233,208

CONTACT FOR DIRECT RECEPTION OF PRINTED CIRCUIT BOARD

Herbert E. Ruehlemann, Huntingdon Valley, and Herman Gordon, Elkins Park, Pa., assignors to Elco Corporation, Ambler, Pa., a corporation of Pennsylvania Filed Sept. 6, 1963, Ser. No. 307,155
8 Claims. (Cl. 339—176)

This invention relates to a contact which may be secured in an insulating casing in order to form a connector member which will make direct electrical and mechanical contact with the edge of a printed circuit board.

Contacts of this nature have been used heretofore and are known as "bellows type" contacts wherein compression thereof by the inserted printed circuit board proceeds about at least two pivot points to simulate the action of a bellows. The bellows structure enables the contact to firmly grip the printed circuit board even when the assembly is subjected to vibration or wear. Another advantage of the bellows type contact is that the pressure imposed by the contact on the printed circuit board is fairly constant even though the thickness of the particular printed circuit board being employed may vary somewhat.

Prior bellows type contacts have been so constructed as to have the metal strip bent almost a full 180° at each of the two pivot points. This severe bending is practical only when the metal strip is relatively thin.

Unfortunately, however, the tail portion of the contact will necessarily be of the same thickness which is much too weak to accept automatic wire wrapping or to permit crimping about an inserted lead from an outside circuit.

Attempts to overcome the foregoing problems have involved a doubling of the material at the tail or contouring the tail in the longitudinal direction to a V shape. However, this obviously entailed an additional bending and shaping operation. Should a thicker material be used in forming the contact the thickness of the material will make the bending operations at the head of the contact extremely difficult, if not impracticable.

A solution of the foregoing problems is provided in copending application Serial No. 96,819 filed March 20, 1961 on behalf of Herbert E. Ruehlemann and entitled Bellows Type Contact.

The present invention presents an improvement over the devices disclosed and claimed in said application Serial No. 96,819 in several respects including the provision of a double-locking lance and also a deep drawn barrel. Other aspects of the improvements presented by the present invention involve the provision of a symmetrical contact which is reversible and which also when equipped with a pair of wiping fingers may be severed to provide an operational contact with but one wiping finger. Another aspect of the present invention involves the provision of a combination stop tab and inspection opening in connection with the deep drawing of the barrel. Yet another feature of the present invention involves the use of a bi-metallic material in order to achieve resilient properties with respect to the wiping or contact portion and soft or crimpable properties in the barrel.

It is therefore an object of the present invention to provide a bellows type contact from a relatively thick strip of material.

A further object of the present invention is to form a bellows type contact wherein at least one of the pivot points lies in the same plane as the elements about which the pivoting occurs.

The foregoing as well as other objects of this invention are achieved by providing an improved bellows type contact which comprises basically a head section and a tail section, the head section including a combination base and base offset with support legs extending therefrom. The support legs emerge into a pivot arm and a locking lance with the pivot arm extending back toward the base in a pivot bend from which the wiping fingers project. It is the wiping fingers which make actual contact with the conductive strip of a printed circuit board. The wiping fingers are preferably simultaneously stamped from the metal stock at the same time as the other parts are stamped. The tail section is formed by a deep drawing process, during which the stop tab is formed in one of two alternative shapes.

Other objects and many of the intended advantages of this invention will be readily appreciated as the same becomes better understood by reference to the following detailed description when considered in connection with the accompanying drawings wherein.

Referring now in greater detail to the various figures of the drawings wherein similar reference characters refer to similar parts, an improved bellows type contact embodying the present invention is generally shown at 10 in FIG. 1 and is comprised of a highly conductive material.

Figures 1, 2, 9, 10:
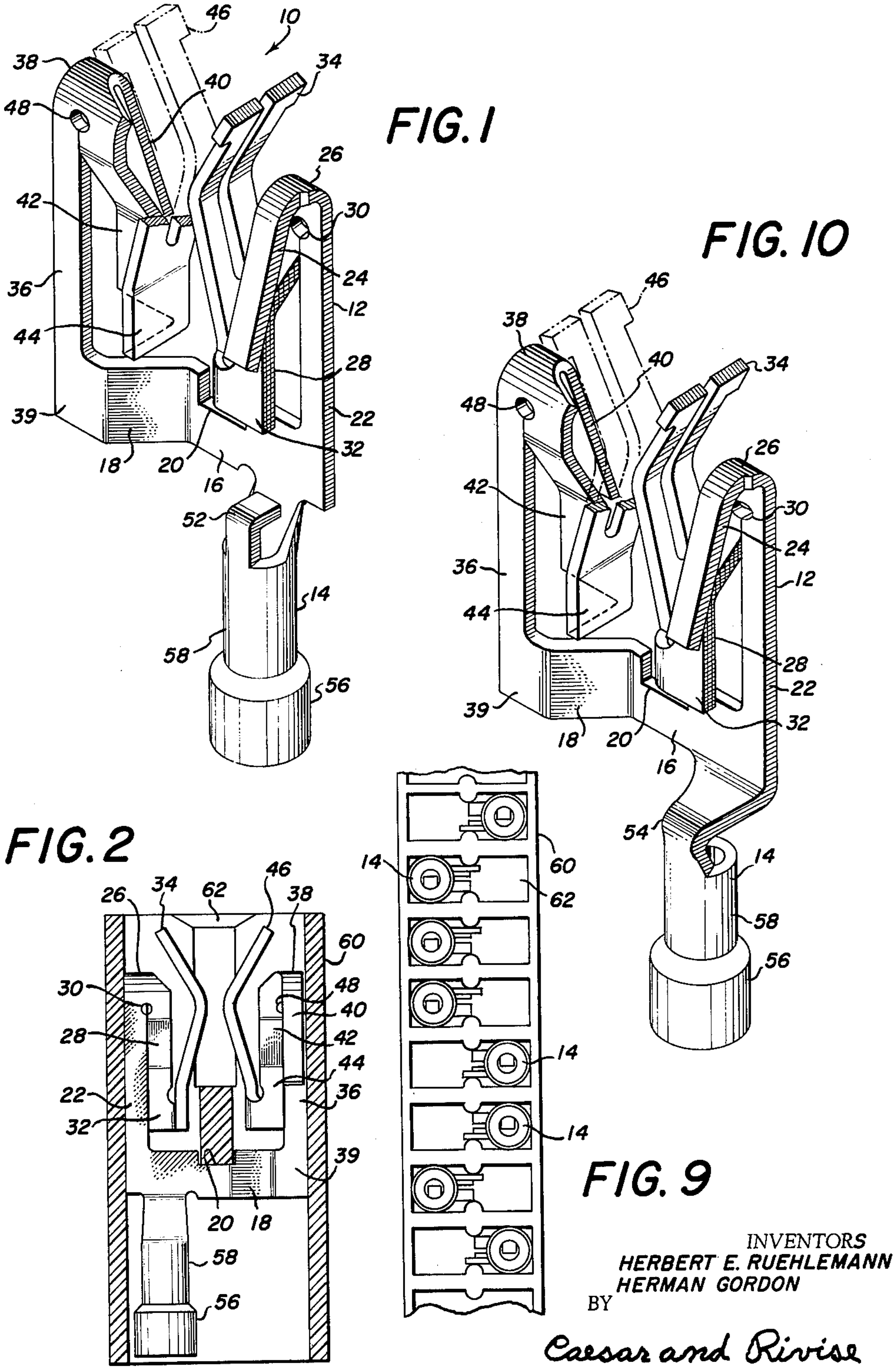
FIG. 1 is a perspective view, partly in phantom, with portions cut away for the sake of clarity.
FIG. 2 is a rear elevational view of the contact of FIG. 1 having been inserted in a complementary insulator or insulating casing.
FIG. 9 is a fragmentary bottom plan view on a reduced scale of the assembly of FIG. 8.
FIG. 10 is a perspective view similar to FIG. 1 but showing a slightly modified contact of the present invention.

The contact 10 as shown in FIG. 1 basically comprises a head section 12 and a tail section 14, and is of a one-piece design.

Figures 3, 4, 5, 6, 7, 8:
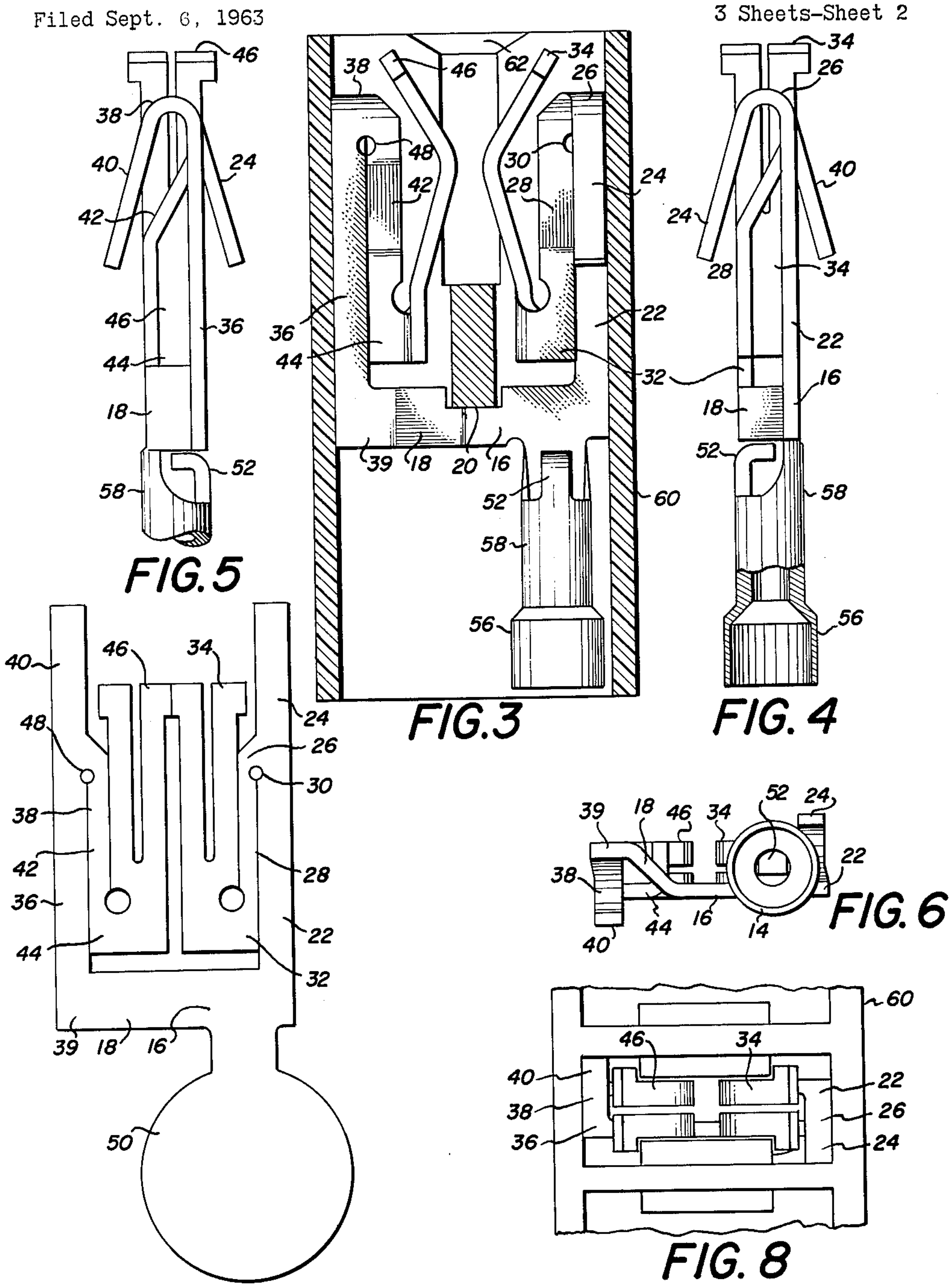
FIG. 3 is a front elevational view of the contact of FIG. 2.
FIG. 4 is a side elevational view of the contact of FIG. 1 taken from a first side thereof.
FIG. 5 is a side elevational view similar to FIG. 4 but taken from the other side thereof.
FIG. 6 is a bottom plan view of the contact of FIG. 1.
FIG. 7 is a plan view of the blank used to form either the contact of FIG. 1 and the contact of FIG. 10.
FIG. 8 is a fragmentary top plan view with portion in section of the contact of FIG. 1 inserted in an insulator or insulating casing.

The head section 12 as illustrated in FIGS. 2 and 3 includes a base 16 which merges laterally into a base offset 18. A slot 2 is provided for a short distance along the inner edge of the base 16 and the base offset 18 for a purpose to be discussed hereinafter.

Extending upwardly from the base 16 is a support leg 22 which as shown in FIG. 1 merges into a first inclined locking lance 24 (bent in front of leg 22) which has a point of departure at flexing point 26 as best shown in FIG. 7. The flexing point 26 is in the nature of a bridging arm which connects both the support leg 22 and the locking lance 24 to downwardly extending pivot arm 28. Opening 30 is provided to facilitate the relative flexing of support leg 22 and pivot arm 28 as will become apparent hereinafter. The pivot arm 28 then merges into a pivot bend 32 from which a bifurcated wiping arm 34 extends upwardly.

In a substantially similar manner a support leg 36 extends upwardly from an extension 39 of the offset 18 so as to be disposed generally parallel to but offset from support leg 22. The support leg 36 merges into a flexing point 38 generally comparable to the flexing point 26. A second inclined locking lance 40 (bent behind leg 36) extends in an inclined manner from the flexing point 38.

A downwardly extending pivot arm 42 is provided which is comparable to the pivot arm 28. The pivot arm 42 merges into a pivot bend 44 from which a bifurcated wiping finger 46 extends. An opening 48 is provided between support leg 36 and pivot arm 42 which is generally similar to the opening 30.

As shown in FIG. 7 the contact of FIGS. 1 or 10 may be stamped from a blank with the various bends and twists being thereafter provided by the use of progressive dies in a manner well known to the art. It is to be noted that the tail section 14 is formed from the round integral blank 50 by deep drawing techniques which are well known to the art. During the deep drawing techniques provision is made for the production of an integral stop tab 52 which functions not only to limit the inward extent of the lead of an outside circuit but also provides a ready view for an observer in order to see that the lead has been properly inserted and crimped in place.

The contact in FIG. 10 is generally similar to that of FIG. 1 with the main difference existing in the fact that instead of the stop tab 52 a convex tab 54 is provided which merges directly into the base 16. Otherwise the barrels 56 of either contact are deep drawn and are preferably soft and crimpable in order to tightly hold an inserted lead. As shown in FIGS. 1 and 10 the barrel 56 is separated from the remainder of the contact by means of a short run 58 of a slightly narrower diameter.

In this connection it is to be noted that the head section 12 of the present contact should be of a spring-type resilient material such as a beryllium-copper alloy. However, the tail section should be of a soft or crimpable material such as a deep drawing brass. This problem can be overcome by forming the entire contact from a string temper material and thereafter selectively heat treating the contact in order to produce a tail section which is soft or crimpable. Alternatively the contact can be formed from a bi-metallic material wherein the head section 12 is of a spring temper material and the tail section 14 is of a soft or crimpable material with the two materials being joined together by well-known techniques such as welding.

Another aspect of the present invention is that the contact 10 includes offset sections such as base offset 18 and pivot arms 28 and 42. These enable the wiping fingers 34 and 46 to be located in symmetrical portions of the head section 12 so that when the contacts are inserted within the rear section of an insulator 60 the tail section 14 may be disposed in either one side of a contact chamber 62 or the the other side of the contact chamber 62 as illustrated in FIG. 9. This contributes considerable versatility to the present invention inasmuch as it is more adaptable to space requirements and particularly to space limitations.

Figure 11:
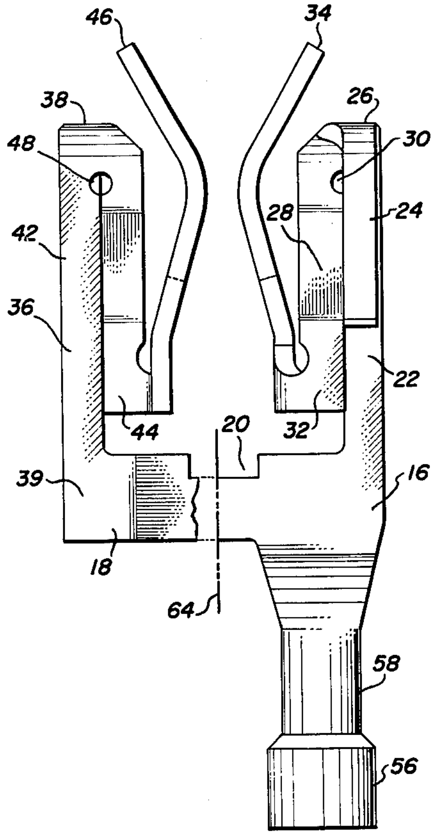
FIG. 11 is a front elevational view of the contact of FIG. 10.
Figure 12:
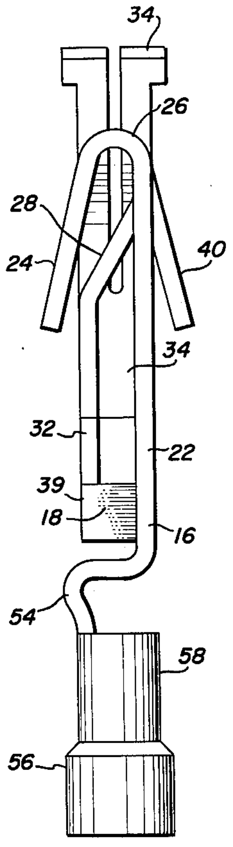
FIG. 12 is a side elevational view of the contact of FIG. 10.

Of further interest is the fact that the contact of the present invention may be severed along approximately its middle section as illustrated by the line 64 of FIG. 11. This is done whenever it is desired to convert a double-bladed contact to a single-bladed contact with the right-hand section of the contact as shown in FIG. 11 constituting the single-bladed contact. Single-bladed contacts are often used in connection with printed circuit boards which carry printed members on both sides thereof. The use of a single-bladed contact preserves the separation of circuitry as between the two sides of the printed circuit board. In this connection, a single-bladed contact may be inserted in each half of the opening comprising contact chamber 62 as shown in FIG. 9.

Another feature of the present invention is the provision of the two locking lances 24 and 40 which are of an elongated inclined design to give a double cantilever effect thereby contributing high flexibility without fatigue. The locking lances are so constructed as to snap back to their original position once the contact has been properly seated in the insulator 60 as illustrated in FIG. 8. In this connection the insulator 60 will possess an internal cam or shoulder which will slightly compress the locking lances as the contact is inserted from the rear of insulator 60. The shoulder or cam then terminates abruptly just before the contact reaches its fully seated position so that the locking lances 24 and 40 then snap to their original position with the contact then being seated and locked in position. Slot 20 also limits the insertion of the contact by fitting about a complementary leg within the insulator.

The contact may be withdrawn from its seated position by compressing the locking lances inwardly toward each other and simultaneously exerting a force tending to push the contact rearwardly and out of the insulator 60.

The wiping fingers 34 and 46 at the present contact are shown in bifurcated form in order to achieve greater flexibility although singular forms of the wiping fingers are contemplated. The wiping fingers 34 and 46 are bent in a convex manner in order to provide better mechanical and electrical contact against the printed members of an inserted printed circuit board which has a tendency to spread the wiping fingers 34 and 46.

This is permitted by virtue of a pivoting action of the pivot bends 32 and 44 which serve as a first pivot point and also as permitted by the flexing points 26 and 38 which serve as second pivot points. In this manner the contact of the present invention exerts a "bellows type" action.

Obviously many modifications and variations of the present invention are possible in the light of the above teachings. It is, therefore, to be understood that within the scope of the appended claims, the invention may be practiced otherwise than as specifically described.

What is claimed as the invention is:

1. A contact seated in an insulating connector member for direct reception of a printed circuit board having printed means thereon, said contact being stamped from a relatively rigid flat conductive strip, said contact comprising a head section and a tail section, said head section including a base having two spaced supporting legs extending therefrom, a pivot arm extending from each of said supporting legs and resilient wiping fingers extending from said pivot arms, elongated locking lances extending in opposite directions from said supporting legs, each locking lance engaging a shoulder in said connector member, the juncture of said supporting legs and pivot arms constituting first pivot sections comprised of lengths of said supporting legs and pivot arms lying substantially in planes and the juncture of said pivot arm and resilient wiping finger constituting a second pivot section comprised of a substantially 90 degree bend, said tail section including a deep barrel having an integral stop tab with an opening associated therewith for inspection of a circuit lead crimped in said barrel, said wiping fingers making electrical and resilient mechanical contact with at least one printed means of said printed circuit board.

2. The invention of claim 1 wherein said outside circuit constitutes a conductive strip of a printed circuit board.

3. The invention of claim 1 wherein each wiping finger lies generally parallel to the respective pivot arm.

4. The invention of claim 3 wherein a plurality of said contacts are affixed to an insulating casing whereby the wiping fingers of the contacts are disposed in opposed parallel rows.

5. The invention of claim 1 wherein said contact has two wiping fingers and wherein said base may be separated at a point to provide a contact with one wiping finger.

6. The invention of claim 1 wherein said base and pivot arms include offset sections whereby the contact may be reversably inserted in an insulator.

7. The invention of claim 1 wherein at least one of said wiping fingers possesses a convex contour.

8. The invention of claim 1 wherein at least one of said wiping fingers is bifurcated at central portions thereof.

References Cited by the Examiner

UNITED STATES PATENTS

| | | | |
|---|---|---|---|
| 1,564,944 | 12/1925 | Colby. | |
| 2,214,065 | 9/1940 | Pennock et al. | 339—134 X |
| 2,726,376 | 12/1955 | Heath | 339—278 X |
| 2,740,735 | 4/1956 | Swain. | |
| 2,783,417 | 2/1957 | Eannarino | 339—192 |
| 2,794,964 | 6/1957 | Hoffman | 339—276 |
| 2,832,013 | 4/1958 | Pedersen et al. | 339—17 X |
| 3,104,925 | 9/1963 | Macnamara | 339—276 X |
| 3,133,780 | 5/1964 | Dean | 339—258 |
| 3,157,452 | 10/1964 | Dorjee et al. | 339—176 |

FOREIGN PATENTS

| | | |
|---|---|---|
| 1,108,263 | 8/1955 | France. |

JOSEPH D. SEERS, *Primary Examiner.*